US008846503B1

(12) United States Patent
Lee et al.

(10) Patent No.: US 8,846,503 B1
(45) Date of Patent: Sep. 30, 2014

(54) SELF-ALIGNED AND LATERAL-ASSEMBLY METHOD FOR INTEGRATING HETEROGENEOUS MATERIAL STRUCTURES ON THE SAME PLANE

(71) Applicant: National Tsing Hua University, Hsinchu (TW)

(72) Inventors: Ming-Chang Lee, Hsinchu (TW); Chih-Kuo Tseng, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/975,524

(22) Filed: Aug. 26, 2013

(30) Foreign Application Priority Data

Aug. 2, 2013 (TW) .............................. 102127795 A

(51) Int. Cl.
*H01L 21/20* (2006.01)
*H01L 21/02* (2006.01)

(52) U.S. Cl.
CPC .... *H01L 21/02532* (2013.01); *H01L 21/02647* (2013.01); *H01L 21/02381* (2013.01); *H01L 21/02455* (2013.01); *H01L 21/02645* (2013.01); *H01L 21/02639* (2013.01)
USPC ...................................................... 438/481

(58) Field of Classification Search
CPC .................. H01L 21/02639; H01L 21/02645; H01L 21/02455; H01L 21/02532; H01L 21/02381; H01L 29/66462; H01L 33/12; H01L 31/0745
USPC ...................................................... 438/481
See application file for complete search history.

(56) References Cited

U.S. PATENT DOCUMENTS

| 6,893,947 | B2 * | 5/2005 | Martinez et al. | 438/555 |
| 8,375,191 | B2 * | 2/2013 | Kim | 711/170 |
| 2004/0142541 | A1 * | 7/2004 | Cohen et al. | 438/479 |
| 2004/0161911 | A1 * | 8/2004 | Chu et al. | 438/479 |
| 2009/0026459 | A1 * | 1/2009 | Chu et al. | 257/65 |
| 2010/0230721 | A1 * | 9/2010 | Yasutake | 257/192 |
| 2012/0003799 | A1 * | 1/2012 | Kim et al. | 438/233 |

FOREIGN PATENT DOCUMENTS

TW    I358755    7/2008

* cited by examiner

*Primary Examiner* — Karen Kusumakar

(57) ABSTRACT

The present invention relates to a self-aligned and lateral-assembly method for integrating heterogeneous material structures on the same plane. By using this method, two semiconductor materials heterogeneous to each other can be laterally assembled in a self-alignment way, without using any epitaxial buffer layers or gradient buffer layers. Therefore, when applying this method to fabricating an electronic device having heterojunction, not only the manufacture cost can be effectively reduced, but the difficulty of manufacturing process can also be overcome. Moreover, in this method, one amorphous heterogeneous semiconductor material would laterally grow to a crystal semiconductor material through epitaxy after being treated the rapid melting growth (RMG) process, and the epitaxial crystal semiconductor material would then be laterally assembled with the other one semiconductor material on an identical substrate, for carrying out the lateral assembly of the two heterogeneous semiconductor materials by using the self-alignment way and the smallest thermal budget.

9 Claims, 10 Drawing Sheets

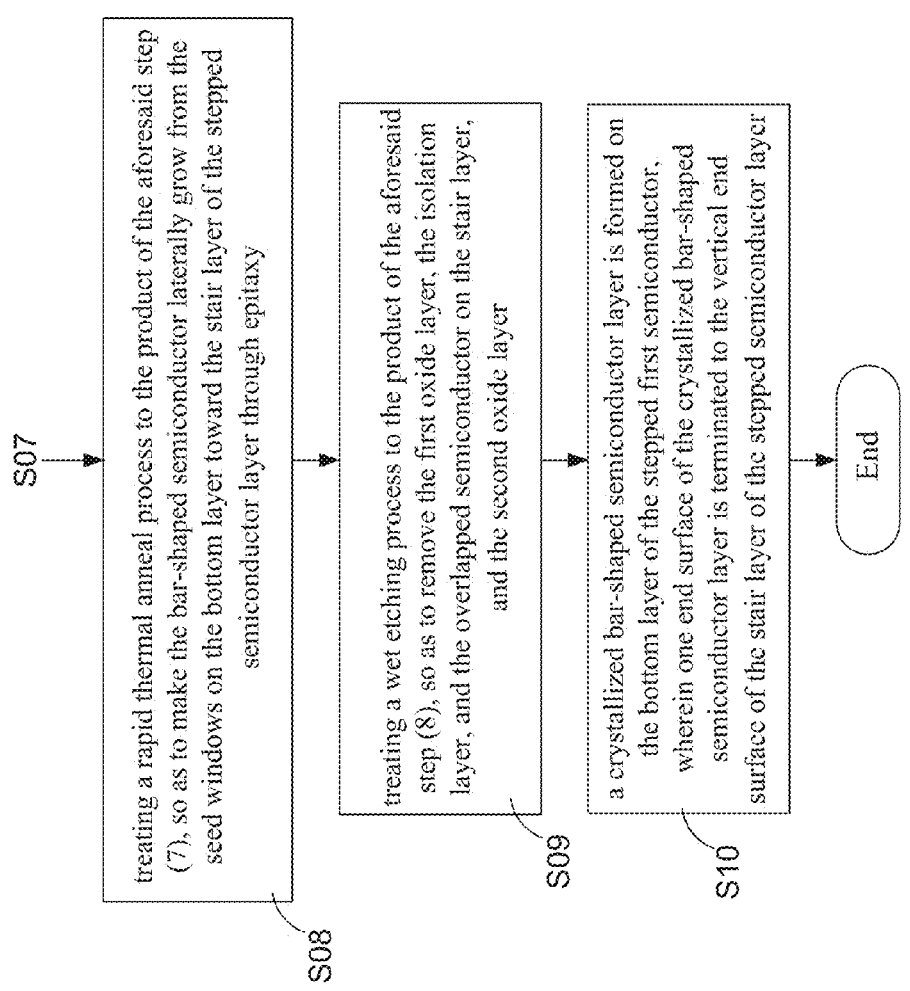

SELF-ALIGNED AND LATERAL-ASSEMBLY METHOD FOR INTEGRATING HETEROGENEOUS MATERIAL STRUCTURES ON THE SAME PLANE

BACKGROUND OF THE INVENTION

1. Field of the Invention

The present invention relates to a manufacturing method with low thermal budget used for stacking different material layers on a substrate, and more particularly, to a self-aligned and lateral-assembly method for integrating heterogeneous material structures on the same plane.

2. Description of the Prior Art

Silicon is currently a conventional semiconductor material, which is now widely used for CMOS devices and becomes an indispensable material for Integrated Circuits (ICs). However, silicon still can not be broadly applied to optoelectronic and high-frequency communications due to the limitation on its electron mobility (1350 cm$^2$/V-S), hole mobility (480 cm$^2$/V-S) and energy gap (1.12 eV). On the contrary, germanium (Ge) has higher electron mobility (~3900 cm$^2$/V-S) and hole mobility (~1900 cm$^2$/V-S) as well as lower energy gap (0.67 eV), therefore research and academic institutions all commit to the researches of germanium materials in optoelectronic and high-frequency electronic devices.

Recently, epitaxial films of Silicon-germanium (SiGe) become a popular material structure, and furthermore, the so-called hetero-junction semiconductor devices formed by monocrystalline silicon-germanium ($Si_{1-x}Ge_x$) on silicon substrate are gradually replacing the amorphous silicon optoelectronics, CMOS gate and thermal radiation sensors. However, it is well-known that the lattice constants of pure silicon material and pure germanium material are 5.43 Å and 5.65 Å, respectively. So that, a lattice mismatch of 4.2% would generate misfit dislocation defects between silicon and germanium when growing $Si_{1-x}Ge_x$ epitaxial film on a silicon substrate; therefore, forming the $Si_{1-x}Ge_x$ epitaxial film on the silicon substrate becomes difficult.

For growing $Si_{1-x}Ge_x$ epitaxial film on silicon substrate, R.O.C. patent of TW I358755 teaches a method for manufacturing a semiconductor heterostructure. Please refer to FIG. 1, which illustrates a schematic process flow of the semiconductor heterostructure manufacturing method. As shown in FIG. 1, the method firstly grows a buffer layer 3' of $Si_{1-x}Ge_x$ on a Si substrate 2' by epitaxy, wherein the concentration of Si/Ge in the buffer layer 3' is changed according to the thickness of the buffer layer 3', so as to make the lattice constant of the buffer layer 3' be slowly changed. Next, a smooth layer 5' having constant Si/Ge concentration is grown on the buffer layer 3', and subsequently, a top layer 6' of strain silicon is deposited on the smooth layer 5'; Then, a donor wafer 12' is completed. Thus, according to the above-mentioned semiconductor heterostructure manufacturing method proposed by TW I358755, it is able to know that the $Si_{1-x}Ge_x$ epitaxial film can be easily grown on silicon substrate through the assist of the buffer layer and the strain silicon layer.

Besides the semiconductor heterostructure manufacturing method taught by TW I358755, many research and academic institutions also propose some technologies for manufacturing semiconductor heterostructure; However, in summary, the conventional semiconductor heterostructure manufacturing methods still include the shortcoming and drawbacks as follows:

1. Whatever Ultra-high Vacuum Chemical Vapor Deposition (HV/CVD), Rapid-Thermal Chemical Vapor Deposition (RTCVD), Rapid-Thermal Chemical Vapor Deposition (RTCVD), or Metal-organic Chemical Vapor Deposition (MOCVD), the high temperature of 600° C.~1000° C. in process lead to high thermal budget in manufacturing and integrating other electronic devices.

2. Although the lattice mismatch issue can be solved by using the buffer layer in the conventional semiconductor heterostructure manufacturing method, not all of the heterogeneous materials have a suitable buffer layer for allowing it to be grown on Si substrate; in addition, because the buffer layer is full of lattice defects, which are against to vertical integration of devices. Although some semiconductor fabricator use direct wafer bonding way to solve above-mentioned issue, the wafer alignment between a donor wafer and the device wafer and how to remove the substrate become new issues. Moreover, the yield of the wafer bonding process always relies on the high request on the surface flatness of wafers.

3. Moreover, the most important is that, the above-mentioned technology for manufacturing semiconductor heterostructure is not applicable to laterally join a SiGe epitaxial film to a silicon structural layer at the same planar level.

Accordingly, in view of the conventional semiconductor heterostructure manufacturing method still have shortcomings and drawbacks, the inventor of the present application has made great efforts to make inventive research thereon and eventually provided a self-aligned and lateral-assembly method for integrating heterogeneous material structures on the same plane.

SUMMARY OF THE INVENTION

The primary objective of the present invention is to provide a self-aligned and lateral-assembly method for integrating heterogeneous material structures on the same plane; by using this method, two heterogeneous semiconductor materials laterally join to each other, for example, a Ge film and a silicon material, can be precisely and laterally assembled on the same substrate without using any epitaxial buffer layers or gradient buffer layers. Therefore, when applying this method to fabricating an electronic device on lateral heterogeneous material structures, not only the manufacture cost can be effectively reduced, but the difficulty of manufacturing process can also be overcome. Moreover, in this method, one precursor amorphous heterogeneous semiconductor material would laterally transformed to be a single-crystal semiconductor after being treated with a so called rapid melting growth (RMG) process, and the epitaxial crystal semiconductor material would then be laterally assembled with another semiconductor material on the same substrate, so as to carry out the lateral assembly of the two heterogeneous semiconductor materials together by using the self-alignment way with small thermal budget.

Accordingly, to achieve the above objectives of the present invention, the inventor of the present invention provides a self-aligned and lateral-assembly method for integrating heterogeneous material structures on the same plane, comprising the steps of:

(1) fabricating a substrate;

(2) forming a first semiconductor material and a first oxide layer on the substrate;

(3) treating lithography etching process to the first semiconductor material and the first oxide layer, so as to make the first semiconductor material to a stepped semiconductor layer on the substrate, wherein the stepped semiconductor layer comprises a bottom layer and a stair layer, and a height difference is formed between the bottom layer and the stair layer;

(4) forming an isolation layer for covering the substrate, the stepped semiconductor layer and the first oxide layer except for a plurality of through holes opened on the bottom layer of the stepped semiconductor layer, wherein the through holes are used as epitaxy seed windows;

(5) forming a second semiconductor material on the isolation layer, wherein part of the second semiconductor material would be filled into the through holes, so as to contact with the bottom layer of the stepped semiconductor layer;

(6) treating lithography and etching process to define the second semiconductor material, so as to make the second semiconductor material to be a bar-shaped semiconductor covering the through holes and being across the step of the first semiconductor to form a disconnected overlapped semiconductor, wherein the bar-shaped semiconductor and the overlapped semiconductor are formed on the bottom layer and the stair layer of the stepped semiconductor layer, respectively;

(7) forming a second oxide layer for covering the product of the aforesaid step (6), and modulating the thickness of the second oxide layer to completely cover the stepped semiconductor layer;

(8) treating a rapid thermal anneal process to the product of the aforesaid step (7), so as to make the bar-shaped semiconductor laterally grow from the seed windows on the bottom layer toward the stair layer of the stepped semiconductor layer through epitaxy;

(9) treating a wet etching process to the product of the aforesaid step (8), so as to remove the first oxide layer, the isolation layer, and the overlapped semiconductor on the stair layer, and the second oxide layer; and

(10) a crystallized bar-shaped semiconductor layer is formed on the bottom layer of the stepped first semiconductor, wherein one end surface of the crystallized bar-shaped semiconductor layer is terminated to the vertical end surface of the stair layer of the stepped semiconductor layer.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIGS. 2A, 2B and 2C are flow charts of a self-aligned and lateral-assembly method for integrating heterogeneous material structures on the same plane according to the present invention;

DETAILED DESCRIPTION OF THE PREFERRED EMBODIMENTS

To more clearly describe a self-aligned and lateral-assembly method for integrating heterogeneous material structures on the same plane according to the present invention, embodiments of the present invention will be described in detail with reference to the attached drawings hereinafter.

Figure 1:
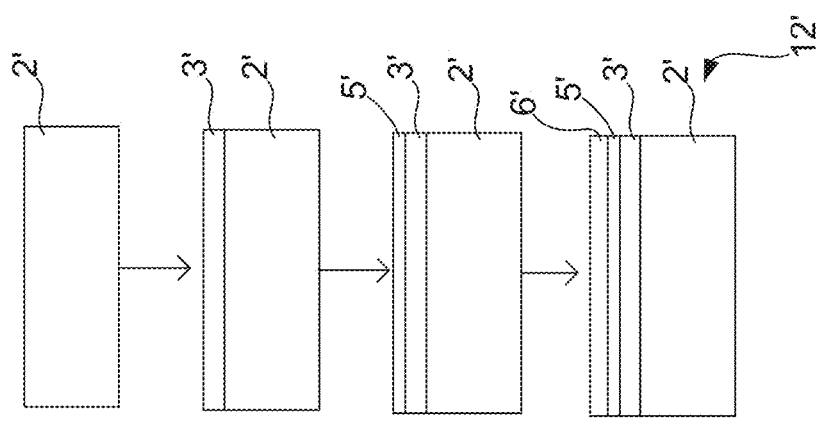
FIG. 1 is a schematic process view of a conventional semiconductor heterostructure manufacturing method.
Figure 2A:
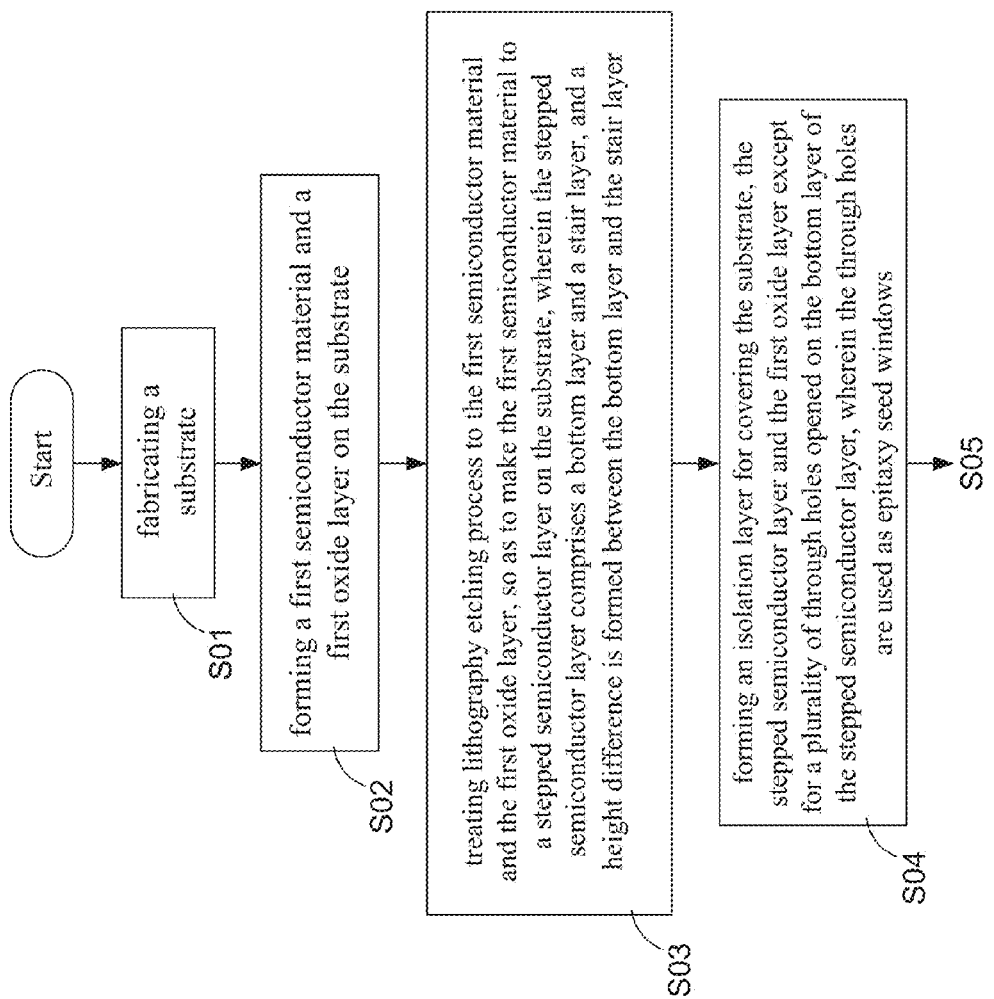
Figure 2B:
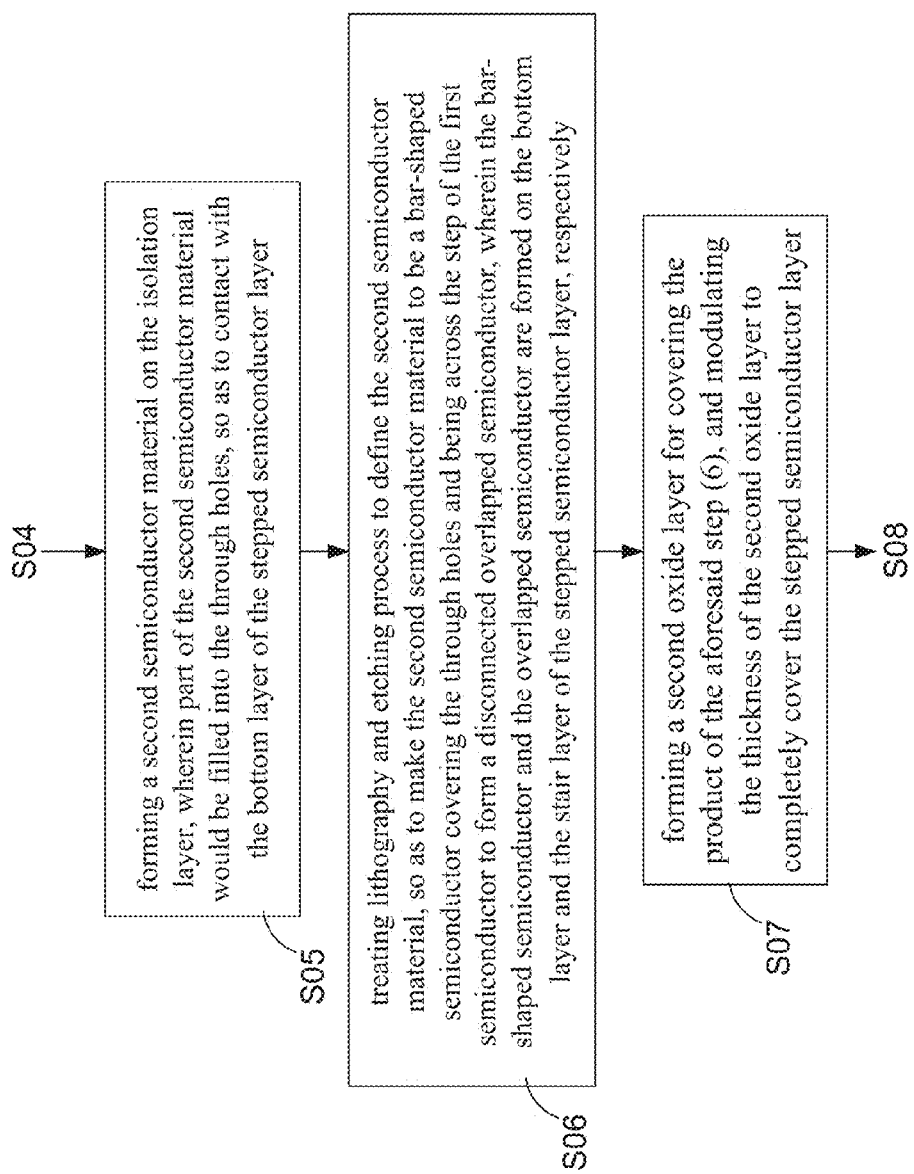

Referring to FIGS. 2A, 2B and 2C, there are shown flow charts of a self-aligned and lateral-assembly method for integrating heterogeneous material structures on the same plane according to the present invention; moreover, please refer to FIGS. 3A, 3B, 3C, 3D, and 3E, which illustrate schematic drawings for the manufacturing processes of the self-aligned and lateral-assembly method for integrating heterogeneous material structures on the same plane. In FIGS. 3A-3E, the right-side drawings represent the top views of the devices in each of manufacturing process steps, and the right-side drawings are the cross-sectional side views of the devices. As shown in FIGS. 2A-2C, the self-aligned and lateral-assembly method for integrating heterogeneous material structures on the same plane consists of 10 primary manufacturing process steps.

Figure 3A:
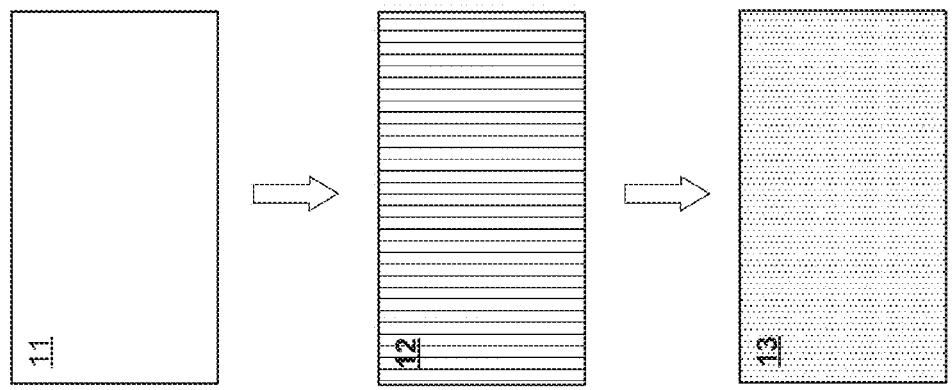
FIGS. 3A, 3B, 3C, 3D, and 3E are schematic drawings for the manufacturing processes of the self-aligned and lateral-assembly method for integrating heterogeneous material structures on the same plane.
Figure 3A:
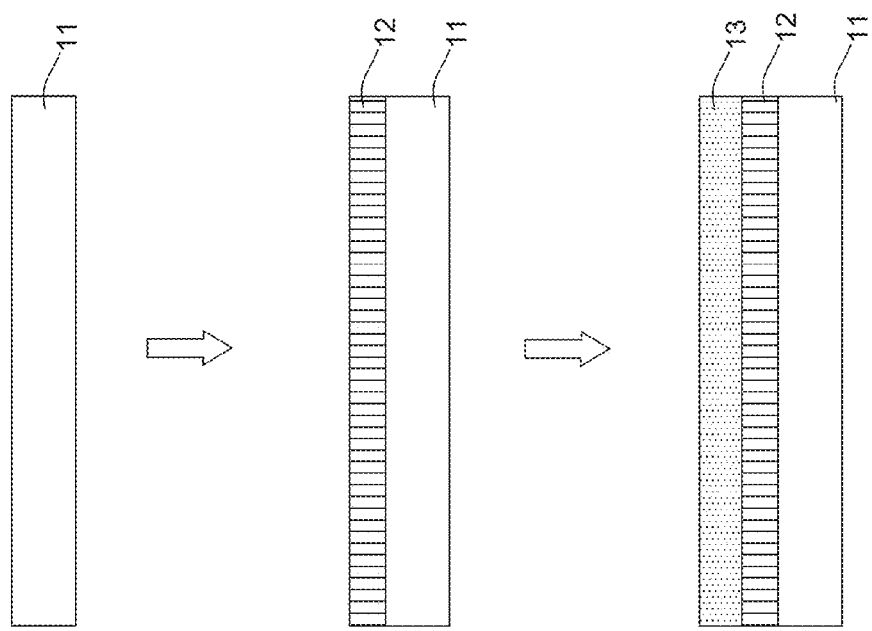
Figure 3B:
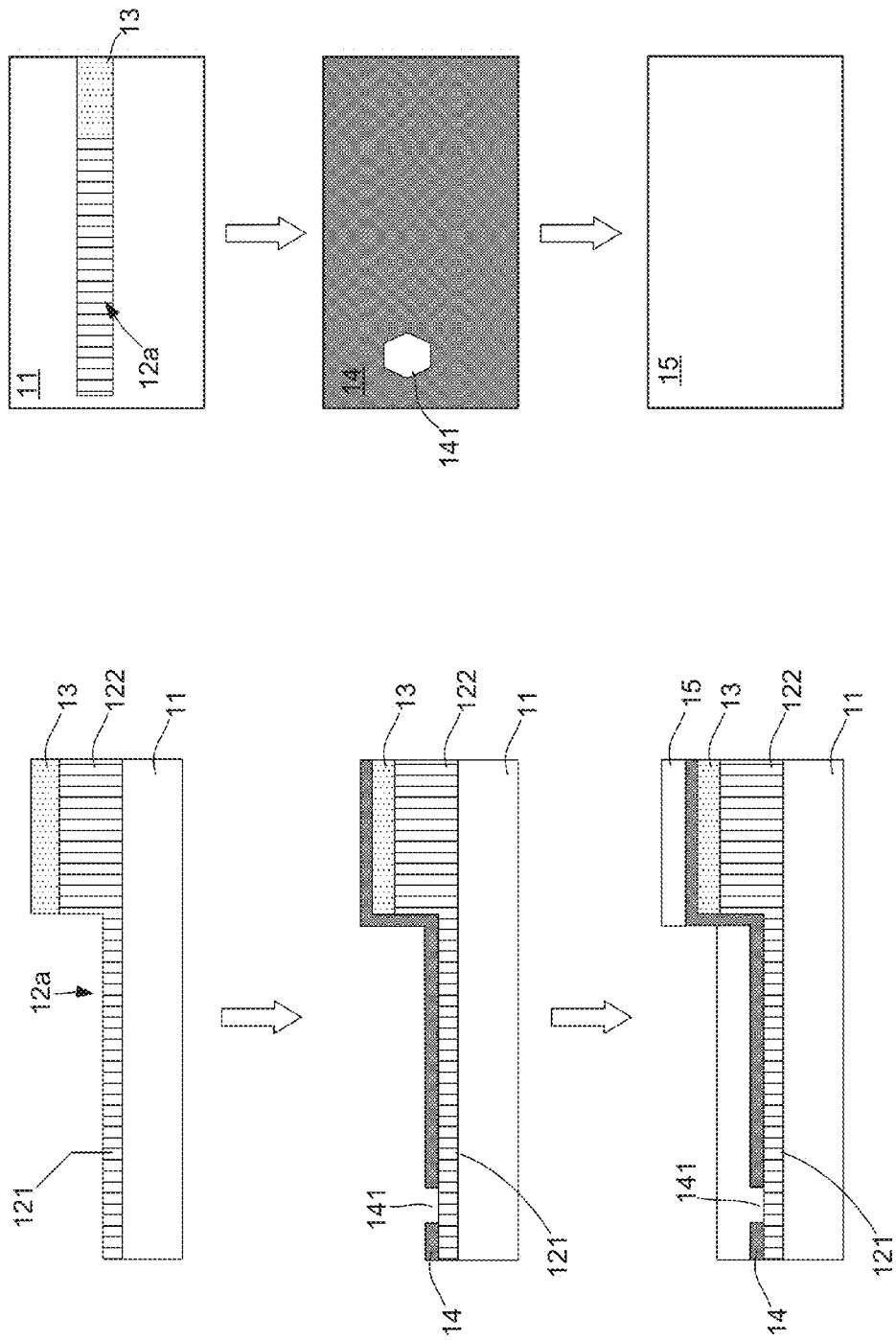

As shown in FIG. 2A and FIG. 3A, the method begins with step (S01) and step (S02) for fabricating a substrate 11 and forming a first semiconductor material 12 and a first oxide layer 13 on the substrate 11. Next, as shown in FIG. 2A, FIG. 2B and FIG. 3B, the method continuously proceeds to step (S03) for treating lithography etching process to the first semiconductor material 12 and the first oxide layer 13, so as to make the first semiconductor material 12 to a stepped semiconductor layer 12a on the substrate 11, wherein the stepped semiconductor layer 12a comprises a bottom layer 121 and a stair layer 122, and a height difference is formed between the bottom layer 121 and the stair layer 122. After the step (S03) is completed, step (S04) and step (S03) are then be executed for forming an isolation layer 14 for covering the substrate 11, the stepped semiconductor layer 12a and the first oxide layer 13 except for a plurality of through holes 141 opened on the bottom layer 121 of the stepped semiconductor layer 12a, and forming a second semiconductor material 15 on the isolation layer 14, wherein the through hole 141 is used as an epitaxy seed window and the part of the second semiconductor material 15 would be filled into the through hole 141, so as to contact with the bottom layer 121 of the stepped semiconductor layer 12a.

Figure 3C:
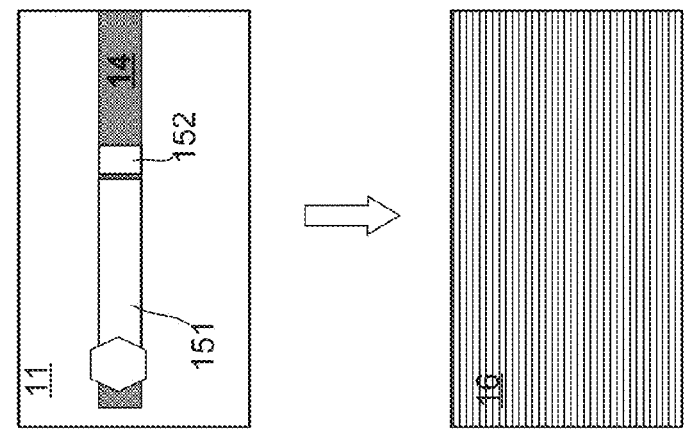
Figure 3C:
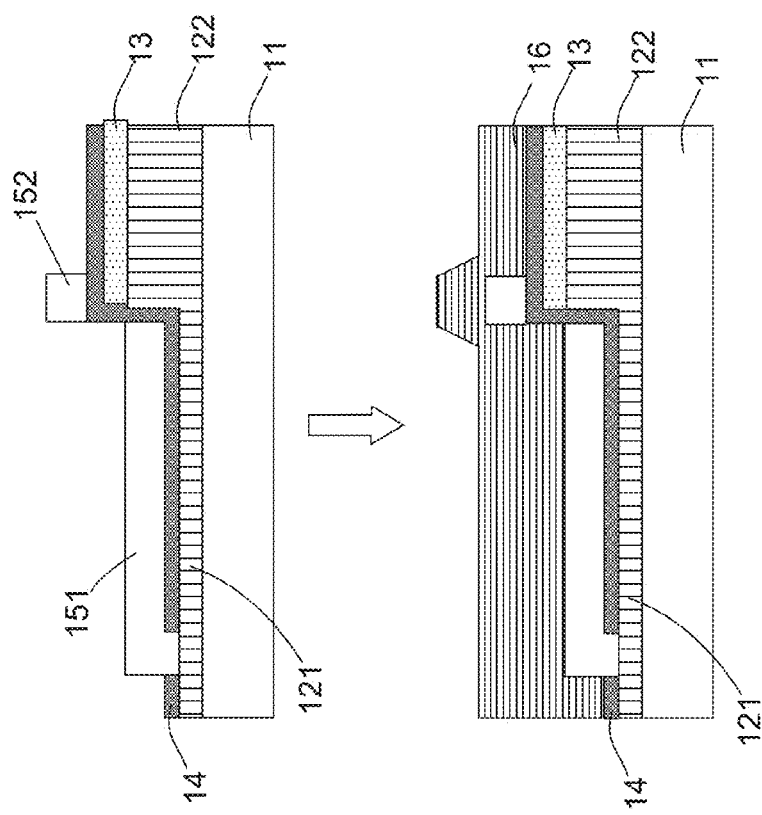
Figure 3D:
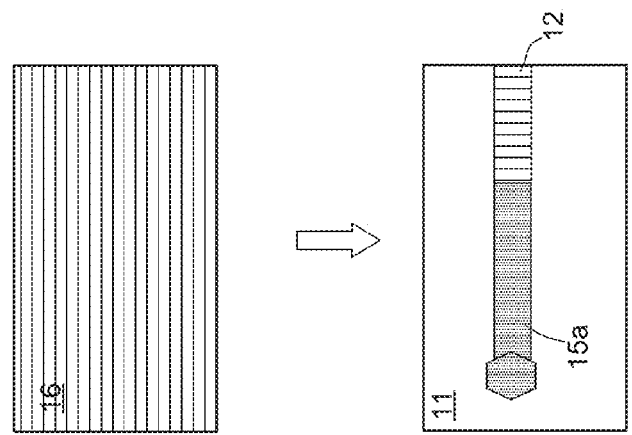
Figure 3D:
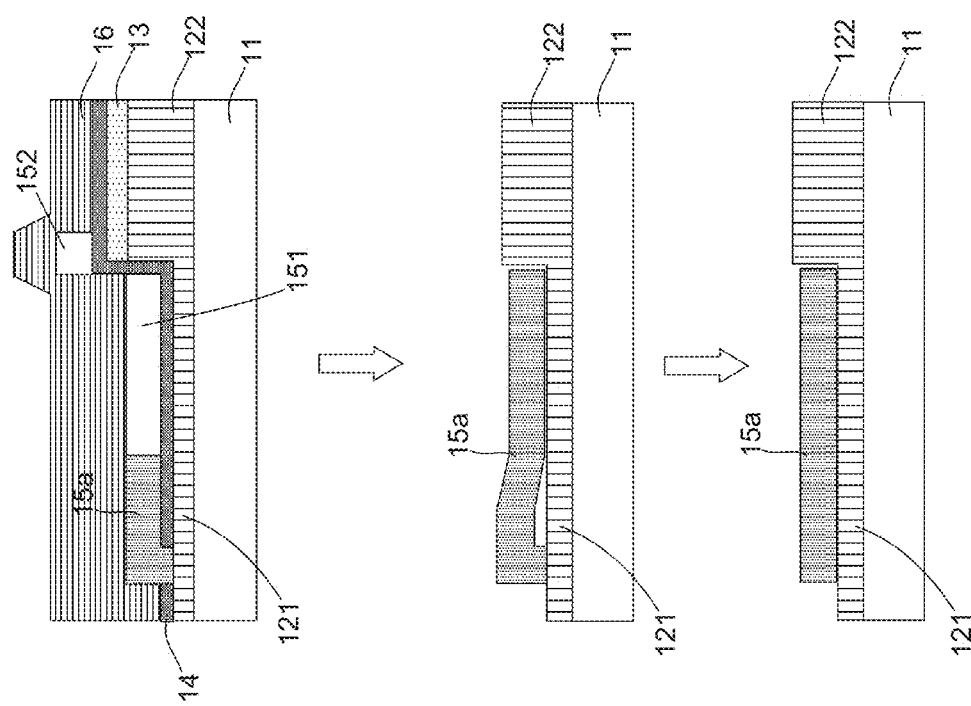

As shown in FIG. 2B and FIG. 3C, after finishing step (S05), the method next proceeds to step (S06) for treating lithography and etching processes to define the second semiconductor material 15, so as to make the second semiconductor material 15 to be a bar-shaped structure semiconductor 151 covering the through hole 141 and being across the step of the stepped semiconductor layer 12a to form a disconnected overlapped semiconductor 152, wherein the bar-shaped structure semiconductor 151 and the overlapped structure semiconductor 152 are formed on the bottom layer 121 and the stair layer 122 of the stepped semiconductor layer 12a, respectively. Subsequently, step (S07) is executed for forming a second oxide layer 16 for covering the product of the aforesaid step (6), and modulating the thickness of the second oxide layer 16 to completely cover the stepped semiconductor layer 12a. After the step (S07) is completed, as shown in FIG. 2C and FIG. 3D, the method proceeds to step (S08) for treating a rapid thermal anneal process to the product of the aforesaid step (7), so as to make the bar-shaped semiconductor layer 151 laterally recrystallized from the seed window on the bottom layer 121 toward the stair layer 122 of the stepped semiconductor 12a through epitaxy. Next, the method proceeds to step (S09) for treating wet etching process to the product of the aforesaid step (8), so as to remove the first oxide layer 13, the isolation layer 14, and the overlapped structure semiconductor 152 on the stair layer 122, and the second oxide layer 16.

Figure 3E:
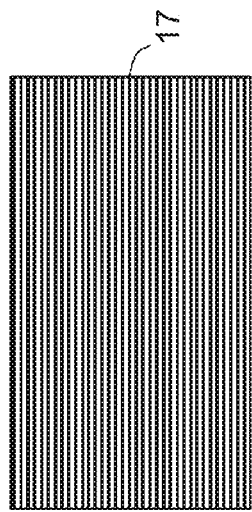
Figure 3E:
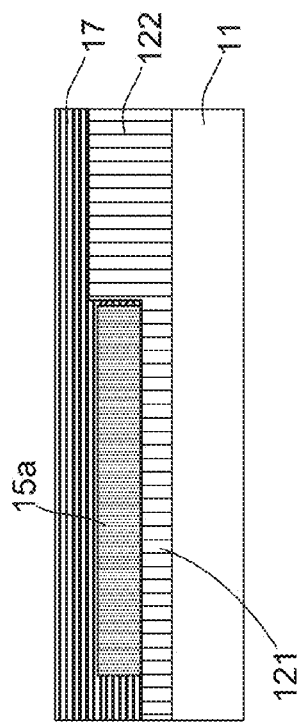
Figure 4:
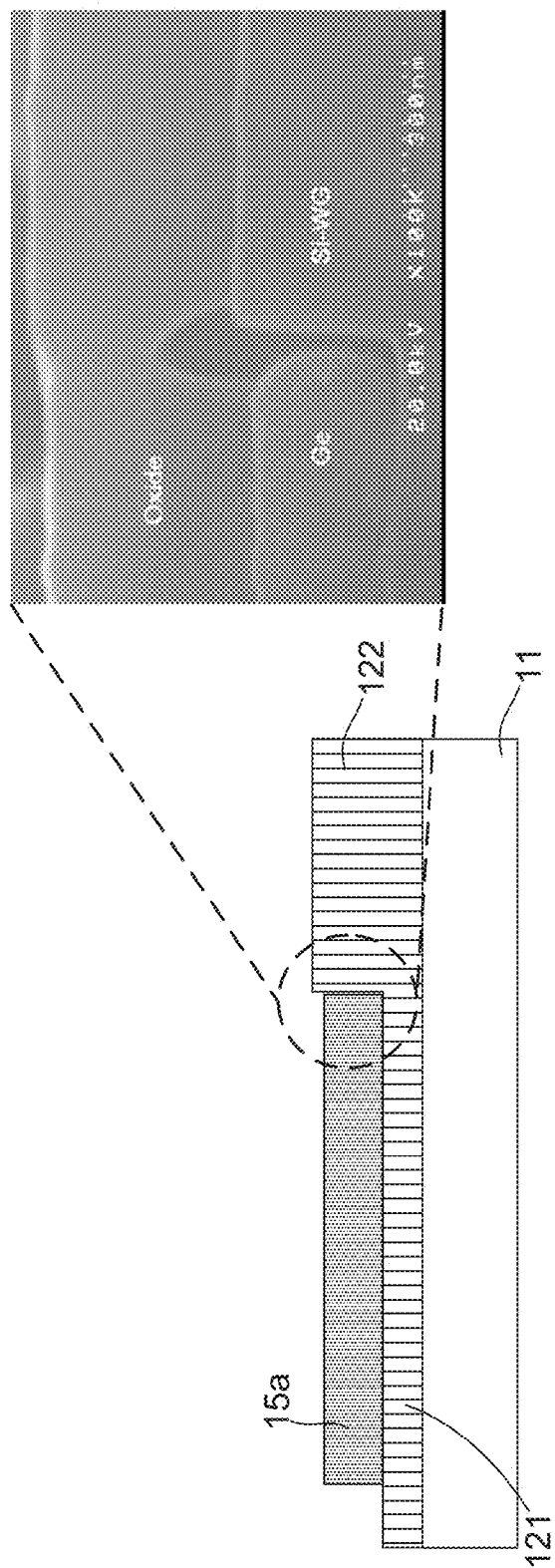
FIG. 4 is a cross-sectional side view and a related SEM (Scanning Electron Microscopy) image of a substrate, a stepped semiconductor layer and a crystal semiconductor layer.

Continuously referring to FIG. 2C and FIG. 3D, and please refer to FIG. 4, which illustrates a cross-sectional side view and a related SEM (Scanning Electron Microscopy) image of the substrate 11, the stepped semiconductor layer 12a and the crystallized bar-shaped semiconductor layer 15a. After the aforesaid steps (S01)-(S09) are completed, as shown in FIG. 3D and FIG. 4, a crystallized bar-shaped semiconductor layer 15*a* is formed on the bottom layer 121 of the stepped semiconductor layer 12*a*, wherein one end surface of the crystallized bar-shaped semiconductor layer 15*a* is terminated to the vertical end surface of the stair layer 122 of the stepped semiconductor layer 12*a*. Furthermore, as shown in FIG. 3E, a passivation layer 17 is formed on the substrate 11, the stepped semiconductor layer 12*a* and the crystallized bar-shaped semiconductor layer 15*a* in order to protect the product of the step (S10).

Herein, it needs to further explain that, because the self-aligned and lateral-assembly method for integrating heterogeneous material structures on the same plane of the present invention can be used for making the optical devices having heterojunctions and the electronic devices having heterojunctions, so that the material types of the substrate 11, the first semiconductor material 12, the isolation layer 14, and the second semiconductor material 15 does not be limited. Generally, the substrate 11 can be a silicon substrate, an SOI (silicon on insulator) substrate or a sapphire substrate. In addition, silicon (Si) and oxide layer are commonly used as the first semiconductor material 12 and the isolation layer, respectively.

Particularly, in the present invention, the second semiconductor material 15 is a heterogeneous material opposite to the first semiconductor material 12 (i.e., silicon), wherein the materials of germanium (Ge), silicon germanium ($Si_{1-x}Ge_x$), II-VI compound semiconductor material, and III-V compound semiconductor material are commonly heterogeneous material opposite to the first semiconductor material 12. For the III-V compound semiconductor material, which may be gallium arsenide (GaAs), indium phosphide (InP), aluminum gallium arsenide ($Al_xGa_{1-x}As$), indium gallium phosphide (InGaP), or indium gallium arsenide phosphide (InGaAsP).

Thus, through above descriptions, the self-aligned and lateral-assembly method for integrating heterogeneous material structures on the same plane of the present invention has been clearly and completely introduced and described; in summary, the present invention includes the advantages of:

(1) By using the self-aligned and lateral-assembly method for integrating heterogeneous material structures on the same plane of the present invention, two semiconductor materials heterogeneous to each other can be laterally assembled in a self-aligned way, without using any epitaxial buffer layers or gradient buffer layers. Therefore, when applying this method to fabricating an electronic device having heterojunction, not only the manufacture cost can be effectively reduced, but the difficulty of manufacturing process can also be overcome. So that, because the self-aligned and lateral-assembly method of the present invention includes the advantages of simple process steps and low manufacture cost, the method can be widely applied for making the optical devices having heterojunction and the semiconductor devices having heterojunction.

(2) Moreover, by using the self-aligned and lateral-assembly method for integrating heterogeneous material structures on the same plane of the present invention, one amorphous heterogeneous semiconductor material (i.e., the second semiconductor material 15) would re-crystallized to a crystal semiconductor material through lateral epitaxy after being treated by the rapid melting growth (RMG) process, and the epitaxial crystal semiconductor material would then be laterally assembled with the other one semiconductor material on an identical substrate, so as to carry out the lateral assembly of the two heterogeneous semiconductor materials together by using the self-alignment way with small thermal budget.

The above description is made on embodiments of the present invention. However, the embodiments are not intended to limit scope of the present invention, and all equivalent implementations or alterations within the spirit of the present invention still fall within the scope of the present invention.

What is claimed is:

1. A self-aligned and lateral-assembly method for integrating heterogeneous material structures on the same plane, comprising the steps of:
   (1) fabricating a substrate;
   (2) forming a first semiconductor material and a first oxide layer on the substrate;
   (3) treating lithography etching process to the first semiconductor material and the first oxide layer, so as to make the first semiconductor material to a stepped semiconductor layer on the substrate, wherein the stepped semiconductor layer comprises a bottom layer and a stair layer, and a height difference is formed between the bottom layer and the stair layer;
   (4) forming an isolation layer for covering the substrate, the stepped semiconductor layer and the first oxide layer except for a plurality of through holes opened on the bottom layer of the stepped semiconductor layer, wherein the through holes are used as epitaxy seed windows;
   (5) forming a second semiconductor material on the isolation layer, wherein part of the second semiconductor material would be filled into the through holes, so as to contact with the bottom layer of the stepped semiconductor layer;
   (6) treating lithography and etching process to define the second semiconductor material, so as to make the second semiconductor material to be a bar-shaped semiconductor covering the through holes and being across the step of the first semiconductor to form a disconnected overlapped semiconductor, wherein the bar-shaped semiconductor and the overlapped semiconductor are formed on the bottom layer and the stair layer of the stepped semiconductor layer, respectively;
   (7) forming a second oxide layer for covering the product of the aforesaid step (6), and modulating the thickness of the second oxide layer to completely cover the stepped semiconductor layer;
   (8) treating a rapid thermal anneal process to the product of the aforesaid step (7), so as to make the bar-shaped semiconductor laterally grow from the seed windows on the bottom layer toward the stair layer of the stepped semiconductor layer through epitaxy;
   (9) treating a wet etching process to the product of the aforesaid step (8), so as to remove the first oxide layer, the isolation layer, and the overlapped semiconductor on the stair layer, and the second oxide layer; and
   (10) a crystallized bar-shaped semiconductor layer is formed on the bottom layer of the stepped first semiconductor, wherein one end surface of the crystallized bar-shaped semiconductor layer is terminated to the vertical end surface of the stair layer of the stepped semiconductor layer.

2. The self-aligned and lateral-assembly method for integrating heterogeneous material structures on the same plane of claim 1, further comprising the steps of:
   (11) forming a passivation layer on the substrate, the stepped semiconductor layer and the crystallized bar-shaped semiconductor layer.

3. The self-aligned and lateral-assembly method for integrating heterogeneous material structures on the same plane of claim 1, wherein the substrate is selected from the group consisting of: silicon substrate, SOI (silicon on insulator) substrate and sapphire substrate.

4. The self-aligned and lateral-assembly method for integrating heterogeneous material structures on the same plane of claim 1, wherein the first semiconductor material is silicon (Si) and the material of the isolation layer is oxide ($SiO_2$).

5. The self-aligned and lateral-assembly method for integrating heterogeneous material structures on the same plane of claim 4, wherein the second semiconductor material is a heterogeneous material opposite to the first semiconductor material.

6. The self-aligned and lateral-assembly method for integrating heterogeneous material structures on the same plane of claim 5, wherein the heterogeneous material is selected from the group consisting of: germanium (Ge), silicon germanium ($Si_{1-x}Ge_x$), II-VI compound semiconductor material, and III-V compound semiconductor material.

7. The self-aligned and lateral-assembly method for integrating heterogeneous material structures on the same plane of claim 6, wherein the aforesaid III-V compound semiconductor material is selected from the group consisting of: gallium arsenide (GaAs), indium phosphide (InP), aluminum gallium arsenide ($Al_xGa_{1-x}As$), indium gallium phosphide (InGaP), and indium gallium arsenide phosphide (InGaAsP).

8. The self-aligned and lateral-assembly method for integrating heterogeneous material structures on the same plane of claim 4, wherein the second semiconductor material is a homogeneous material opposite to the first semiconductor material.

9. The self-aligned and lateral-assembly method for integrating heterogeneous material structures on the same plane of claim 8, wherein the homogeneous material is selected from the group consisting of: silicon (Si), silicon carbide (SiC) and silicon nitride ($Si_3N_4$).

* * * * *